United States Patent
Bachmann et al.

(10) Patent No.: US 10,516,252 B2
(45) Date of Patent: Dec. 24, 2019

(54) LASERDIODE

(71) Applicant: OSRAM Opto Semiconductors GmbH, Regensburg (DE)

(72) Inventors: Alexander Bachmann, Ismaning (DE); Volker Grossmann, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/902,045

(22) Filed: Feb. 22, 2018

(65) Prior Publication Data

US 2018/0241178 A1 Aug. 23, 2018

(30) Foreign Application Priority Data

Feb. 23, 2017 (DE) .................. 10 2017 103 789

(51) Int. Cl.
| | |
|---|---|
| *H01S 3/038* | (2006.01) |
| *H01S 5/22* | (2006.01) |
| *H01S 5/32* | (2006.01) |
| *H01S 5/40* | (2006.01) |
| *B82Y 20/00* | (2011.01) |
| *H01S 5/34* | (2006.01) |

(52) U.S. Cl.
CPC ............ *H01S 5/3201* (2013.01); *B82Y 20/00* (2013.01); *H01S 5/4031* (2013.01); *H01S 5/22* (2013.01); *H01S 5/3403* (2013.01); *H01S 2301/176* (2013.01)

(58) Field of Classification Search
CPC .... H01S 5/3201; H01S 5/4031; H01S 5/0425; H01S 2301/18; H01S 5/22; H01S 2301/176; H01S 5/3403; B82Y 20/00
See application file for complete search history.

(56) References Cited

U.S. PATENT DOCUMENTS

| | | | | |
|---|---|---|---|---|
| 5,319,659 A | * | 6/1994 | Hohimer | ............... H01S 5/0425 372/45.01 |
| 6,239,490 B1 | * | 5/2001 | Yamada | ............ H01L 21/28575 257/741 |
| 9,281,656 B2 | * | 3/2016 | Mueller | ............... H01S 5/0425 |
| 2003/0179795 A1 | | 9/2003 | Moriya et al. | |

(Continued)

FOREIGN PATENT DOCUMENTS

| | | |
|---|---|---|
| DE | 10 2008 014 092 A1 | 7/2009 |
| DE | 10 2011 114 865 A1 | 1/2013 |

(Continued)

*Primary Examiner* — Yuanda Zhang
(74) *Attorney, Agent, or Firm* — DLA Piper LLP (US)

(57) ABSTRACT

A laser diode includes an active zone that emits radiation in a lateral emission angle range in a plane of the active zone via an emission side of a layer arrangement, an electrical contact is configured on a top side of the layer arrangement, the electrical contact includes a metallic adhesion layer and at least one metallic contact layer, the adhesion layer is arranged on the layer arrangement, the adhesion layer includes a layer stack including a first and a second layer, the first layer is arranged on the layer arrangement, the first layer is configured in a planar fashion, the second layer is subdivided into at least one first and at least one second partial surface, the adhesion layer is arranged in the first partial surface, and the contact layer is arranged on the first partial surface and in the second partial surface.

18 Claims, 8 Drawing Sheets

(56) References Cited

U.S. PATENT DOCUMENTS

| | | | | |
|---|---|---|---|---|
| 2011/0075693 A1* | 3/2011 | Kuramochi | ............ | H01S 5/0425 |
| | | | | 372/44.01 |
| 2011/0243169 A1* | 10/2011 | Lauer | .................... | H01S 5/0425 |
| | | | | 372/45.01 |
| 2013/0107534 A1* | 5/2013 | Avramescu | ......... | H01S 5/02461 |
| | | | | 362/259 |
| 2014/0146842 A1* | 5/2014 | Avramescu | ......... | H01S 5/02461 |
| | | | | 372/44.01 |

FOREIGN PATENT DOCUMENTS

| DE | 10 2012 111 512 A1 | 5/2014 |
|---|---|---|
| DE | 10 2016 106 949 A1 | 10/2017 |

* cited by examiner

FIG 1
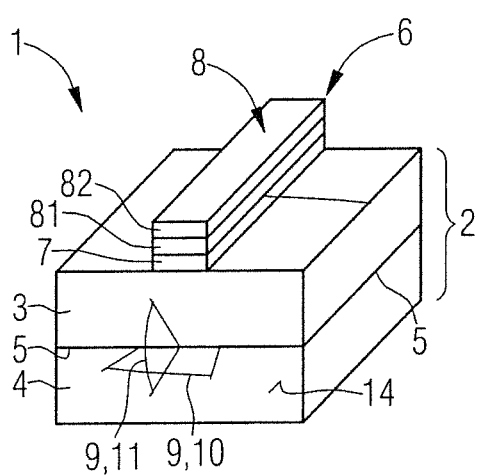
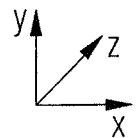
FIG 2
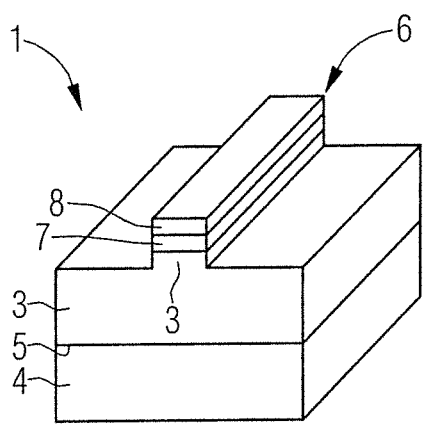
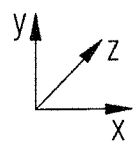
FIG 3
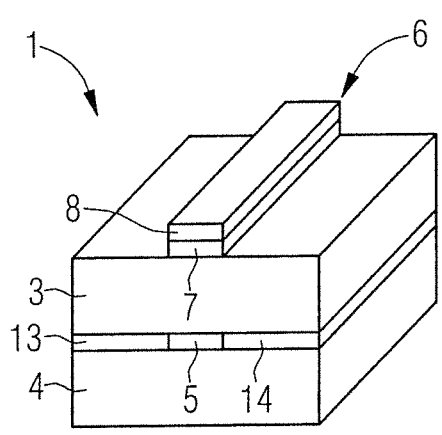
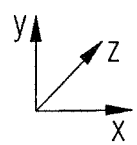

LASERDIODE

TECHNICAL FIELD

This disclosure relates to a laser diode and a method of producing a laser diode.

BACKGROUND

It is known to produce laser diodes comprising semiconductor layers, wherein the laser diodes comprise a gain-guided waveguide structure or an index-guided waveguide structure. A so-called bell contact comprising a layer structure comprising titanium, platinum and gold is used for an electrical contacting of the laser diodes. The titanium layer is deposited on a semiconductor layer and serves as an adhesion layer. Platinum is deposited onto the titanium layer as a diffusion barrier, followed by gold. For a further electrical contacting, a solder may be applied on the gold layer.

The laser diodes are configured to emit electromagnetic radiation via an emission side in an emission angle range. The emission angle range is delimited in a lateral plane arranged parallel to the plane of the active zone, and in a vertical plane configured perpendicularly to the plane of the active zone.

There is therefore a need to provide a laser diode and a method of producing a laser diode in which the lateral angle range for the emission of the electromagnetic radiation comprises a defined size and comprises in particular a small lateral angle range.

SUMMARY

We provide a laser diode including a layer arrangement including at least two semiconductor layers arranged one above another, wherein the semiconductor layers form an active zone in a plane, the active zone generates an electromagnetic radiation, the active zone emits the radiation in a lateral emission angle range in the plane of the active zone via an emission side of the layer arrangement, an electrical contact is configured on a top side of the layer arrangement, the electrical contact includes a metallic adhesion layer and at least one metallic contact layer, the adhesion layer is arranged on the layer arrangement, the adhesion layer includes a layer stack including a first and a second layer, the first layer is arranged on the layer arrangement, the first layer is configured in a planar fashion, the second layer is subdivided into at least one first and at least one second partial surface, the adhesion layer is arranged in the first partial surface, and the contact layer is arranged on the first partial surface and in the second partial surface.

We also provide a method of producing a laser diode, wherein a layer arrangement including at least two semiconductor layers arranged one above another is provided, the semiconductor layers form an active zone, the active zone is configured to generate an electromagnetic radiation, the active zone adjoins an emission side and emits the radiation in a lateral emission angle range in a plane of the active zone, an electrical contact is configured on a top side of the layer arrangement, the electrical contact includes a metallic adhesion layer and a metallic contact layer, the adhesion layer is arranged on the layer arrangement, the contact layer is applied on the adhesion layer, a thickness and/or a structure of the adhesion layer are/is determined to define a lateral emission angle range of the electromagnetic radiation.

BRIEF DESCRIPTION OF THE DRAWINGS

FIG. 1 shows a schematic illustration of a laser diode.

FIG. 2 shows a schematic illustration of an index-guided laser diode.

FIG. 3 shows a schematic illustration of a gain-guided laser diode.

LIST OF REFERENCE SIGNS

Figure 4:
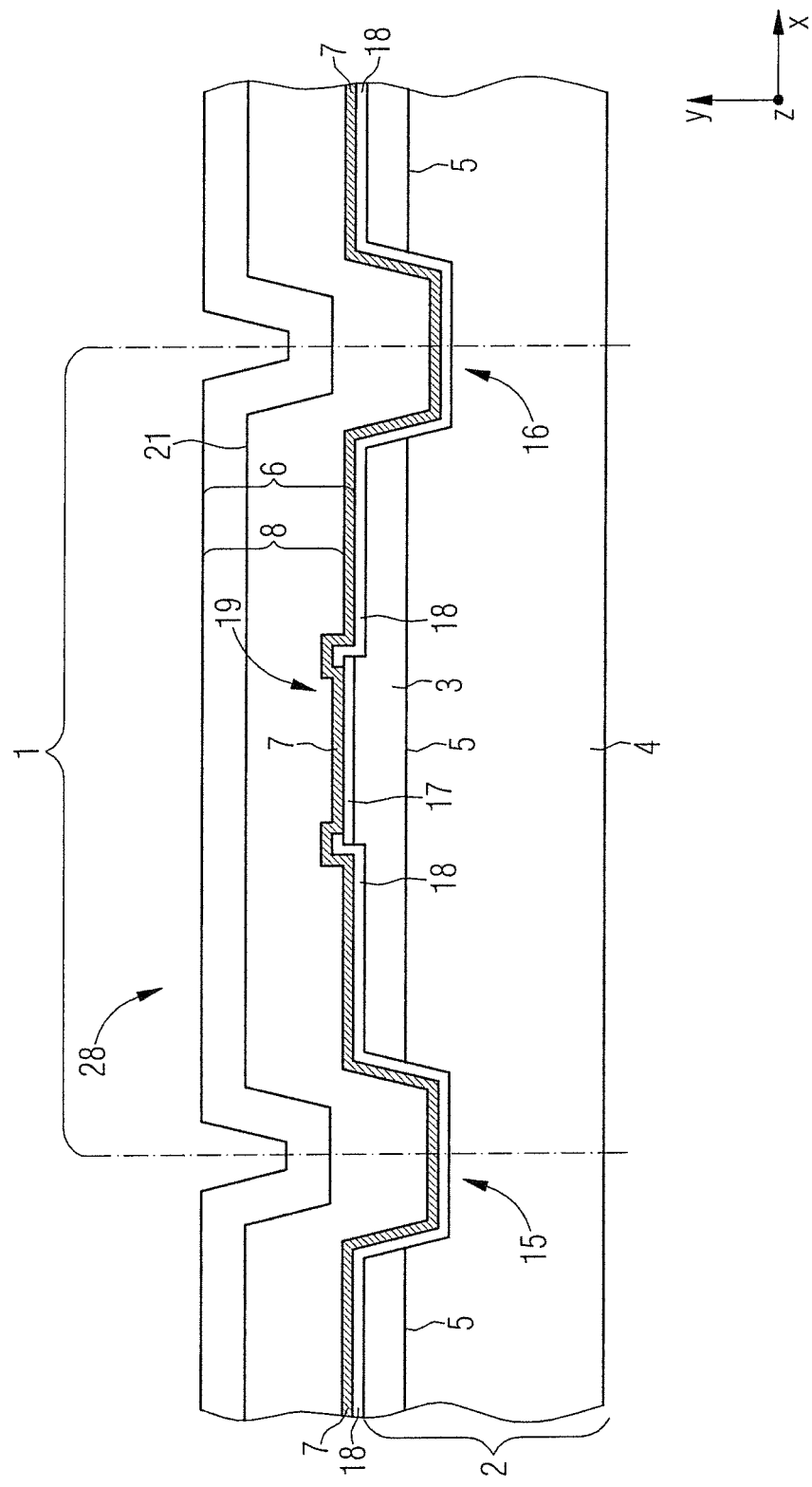
FIG. 4 shows a cross section through a part of a laser bar.

1 Laser diode
2 Layer arrangement
3 First semiconductor layer
4 Second semiconductor layer
5 Active zone
6 Electrical contact
7 Adhesion layer
8 Contact layer
9 Emission region
10 Lateral emission angle range
11 Vertical emission angle range
12 First further semiconductor layer
13 Second further semiconductor layer
14 Emission side
15 First trench
16 Second trench
17 Further contact layer
18 Passivation layer
19 Opening
20 Further metal layer
21 Strain layer
22 First layer of the adhesion layer
23 Second layer of the adhesion layer
24 First partial surface
25 Second partial surface
26 Active region of the active zone
27 Optical waveguide
28 Laser bar
29 Lens
81 Platinum layer
82 Gold layer

DETAILED DESCRIPTION

We provide a laser diode comprising a layer arrangement comprising at least two semiconductor layers arranged one above another. The semiconductor layers form an active zone in a plane. The active zone is configured to generate an electromagnetic radiation and emit it via an emission side. The electromagnetic radiation is emitted in a lateral angle range in the plane of the active zone. For electrical contacting, an electrical contact is configured on the top side of the layer arrangement. The electrical contact comprises a metallic adhesion layer and at least one metallic contact layer. The adhesion layer is arranged on the layer arrangement. The metallic contact layer is arranged on the adhesion layer. The adhesion layer comprises a layer stack comprising a first and a second layer. In this case, the first layer is arranged in a planar fashion on the layer arrangement of the semiconductor layers. The second layer is subdivided into at least one first and at least one second partial surface. The adhesion layer is arranged in the first partial surface. The contact layer is arranged in the second partial surface. The contact layer may be configured, for example, as a gold layer or as a platinum layer. Moreover, a gold layer may be configured on the platinum layer. The second partial layer may comprise a plurality of first partial surfaces and a plurality of second partial surfaces.

As a result of the structuring of the adhesion layer into the first planar layer and the second structured layer, it is possible to set a desired lateral angle range for emission of the electromagnetic radiation. The adhesion function of the adhesion layer is realized by the first layer. The desired influencing of the lateral emission angle range is achieved by the second structured layer of the adhesion layer.

The proposed laser diode comprises the advantage that the lateral angle range for the emission of the electromagnetic radiation is influenced, in particular defined, by the thickness and/or the structure of the adhesion layer. The adhesion layer may be used as a strain layer and the lateral emission angle range may also be reduced, for example, by a reduction of the layer thickness of the adhesion layer or a structuring of the adhesion layer.

As a result of a reduction of the lateral emission angle, it is possible for the laser diode to be operated even at relatively high powers in the event of the radiation being coupled into an optical waveguide. Consequently, the emission angle may be influenced, in particular reduced to a smaller range, in the desired manner only on the basis of the layer thickness and/or the structure of the adhesion layer, independently of the rest of the construction of the laser diode.

The proposed laser diode may be realized both with a gain-guided waveguide structure and an index-guided waveguide structure. The laser diode may likewise be arranged in a bar, wherein the bar comprises a plurality of laser diodes alongside one another. Experiments have shown that the lateral emission angle range is all the smaller, the thinner the adhesion layer is made. This effect may be used advantageously in particular in laser diodes comprising a GaAs material system and/or in particular with the use of titanium as adhesion layer.

The first and/or the second partial surfaces may be configured as strips. The strips may be arranged, for example, transversely with respect to a longitudinal direction of an active region of the active zone.

Furthermore, the first and/or the second partial surfaces may be configured as squares.

Moreover, the first and/or the second partial surfaces may be configured as circular surfaces. Both the squares and circular surfaces can influence the lateral emission angle of the electromagnetic radiation in a defined manner.

The first and/or the second partial surfaces may be arranged in a grid with defined spacings. A uniform influencing of the lateral emission angle range may be achieved by the use of a grid.

A strain layer may be arranged in the metal layer. The strain layer is configured in an electrically conductive fashion and comprises a thickness and/or a structure to influence the lateral emission angle. Consequently, a desired lateral emission angle may be set independently of the adhesion layer with the aid of the strain layer. Suitable materials for the strain layer are titanium or titanium tungsten nitride, for example. The strain layer is formed from a different material than the adjoining metal layer.

The contact layer may comprise a layer arrangement comprising a platinum layer and a gold layer. In this case, the platinum layer is configured as a diffusion barrier for the gold atoms and is arranged on the adhesion layer. The gold layer is arranged on the platinum layer.

The adhesion layer may comprise titanium or is formed from titanium. Titanium is particularly suitable for the configuration of the adhesion layer.

We also provide a method of producing a laser diode, wherein an adhesion layer for a metallic contact is applied on a semiconductor layer structure comprising an active zone, wherein the adhesion layer is configured such that a thickness and/or a structure of the adhesion layer de-fine(s) a defined lateral emission angle range of the electromagnetic radiation of the laser diode.

The above-described properties, features and advantages and the way in which they are achieved will become clearer and more clearly understood in association with the following description of the examples explained in greater detail in association with the drawings.

FIG. 1 shows, in a schematic perspective illustration, a laser diode 1 comprising a layer arrangement 2 comprising two semiconductor layers 3, 4 arranged one above another. An orthogonal coordinate system comprising y-, z- and x-axes orthogonal to one another is illustrated alongside the laser diode 1. The semiconductor layers 3, 4 are positively and negatively conductively doped, respectively, and form an active zone 5 at an interface. In the example illustrated, the first semiconductor layer 3 is positively doped and the second semiconductor layer 4 is negative doped. The active zone 5 may be configured as a simple interface or a quantum well structure comprising quantum well layers and barrier layers. Moreover, even further semiconductor layers may be provided in the layer arrangement.

An electrical contact 6 is arranged on the layer arrangement 2. In the example illustrated, the electrical contact 6 is configured as a lateral strip along the z-direction, wherein the contact 6 comprises a smaller width in the x-direction than the layer arrangement 2. The layer arrangement 2 comprises a larger extent in the z-direction than in the x-direction. Moreover, the layer arrangement 2 comprises a smaller extent in the Y-direction than in the x-direction. The first and second semiconductor layers 3, 4 are configured in z-x-planes and arranged one above the other in a y-direction. The active zone 5 extends in a z-x-plane.

The electrical contact 6 comprises an adhesion layer 7 arranged on the layer arrangement 2 in a z-x-plane. Moreover, the electrical contact 6 comprises a contact layer 8 arranged on the adhesion layer 7. The adhesion layer 7 is formed from a metallic material, in particular from titanium, or comprises at least one metallic material, in particular titanium. The contact layer 8 is likewise formed from a metallic material or comprises a metallic material. The metallic contact layer 8 may comprise two layers, in particular a platinum layer 81 and a gold layer 82. The platinum layer 81 is arranged on the adhesion layer 7. The gold layer 82 is arranged on the platinum layer 81. The contact 6 may also extend laterally beyond the strip shape illustrated. In that case, however, an insulation layer is then arranged between the top side of the first semiconductor layer 3 and the contact 6 outside the strip shape to obtain a strip-shaped delimitation of the contacting of the first semiconductor layer 3.

The active zone 5 is configured to generate an electromagnetic radiation and emit it via an emission region 9 at a side surface 14 constituting an emission side. In the example illustrated, the emission side 14 extends in the y-x-plane. The emission side may also be arranged at an inclination with respect to the z-direction at an angle not equal to 90°.

The emission region 9 comprises a lateral emission angle range 10 and a vertical emission angle range 11. The lateral emission angle range 10 is arranged in the plane of the active zone 5, that is to say in the z-x-plane. The vertical angle range 11 is arranged in the y-z-plane.

Experiments have shown that a desired lateral emission angle range 10 may be set by a defined thickness and/or a defined structure of the adhesion layer 7. Consequently, in addition to the adhesion function for the contact layer 8, the adhesion layer 7 may also be used to set a desired lateral emission angle range 10. Moreover, experiments have shown that the lateral emission angle range 10 is made smaller as the thickness of the adhesion layer 7 decreases. This is advantageous in particular if the intention is to achieve a high beam quality or brilliance, for example. A small lateral emission angle range 10 is advantageous in particular if the electromagnetic radiation is intended to be coupled into a further optical element such as, for example, an optical fiber or an optical fiber laser.

As material for the adhesion layer 7, titanium, in particular, is advantageous in a layer arrangement 2 based on a GaAs material system. The adhesion layer 7 composed of titanium comprises a strain with respect to the layer arrangement 2 based on gallium arsenide. The strain of the adhesion layer is transferred to the electromagnetic properties of the layer structure 2. By reducing the strain, i.e., by reducing the layer thickness of the adhesion layer 7, it is possible to simultaneously achieve a reduction of the lateral emission angle range.

FIG. 2 shows an index-guided laser diode 1, wherein an adhesion layer comprising a defined thickness and/or structure is also used to set a defined lateral emission angle range 10. In this example, the first semiconductor layer 3 is provided with a lateral ridge on a top side, the ridge being aligned along the z-axis. The strip-shaped electrical contact 6 is configured on the ridge of the semiconductor layer 3. The electrical contact 6 may also extend laterally beyond the lateral ridge of the first semiconductor layer 3. In that case, however, an insulation layer is then arranged on side surfaces of the ridge of the first semiconductor layer 3 and on the top side of the first semiconductor layer 3 laterally with respect to the ridge. The insulation layer separates the side surfaces of the ridge of the first semiconductor layer 3 and the top side of the first semiconductor layer 3 laterally with respect to the ridge from the electrical contact 6 to obtain a strip-shaped delimitation of the electrical contacting of the first semiconductor layer 3 to the ridge.

The principle of influencing the lateral emission angle range 10 by a corresponding thickness and/or structure of the adhesion layer 7, which principle was explained with reference to FIG. 1, may also be used in the example of the index-guided laser diode 1, as is illustrated schematically in FIG. 3. FIG. 3 shows a view of a laser diode 1 configured as an index-guided laser diode 1. In this case, between the first and second semiconductor layers 3, 4 the active zone 5 is delimited to a lateral region, that is to say configured only in a delimited region of the x-direction. The regions alongside the active zone 5 are filled with further layers 12, 13 comprising a lower optical refractive index than the active zone 5. The active zone 5 extends along the z-direction as in the other examples.

FIG. 4 shows a schematic partial cross section in a y-x-plane through a laser bar 28 comprising a plurality of laser diodes 1 arranged alongside one another. By way of example, a laser bar 28 may comprise five laser diodes 1 alongside one another configured in a layer arrangement 2. FIG. 4 illustrates a partial cross section through the laser bar 28 that shows one laser diode 1. The further laser diodes 1, not illustrated in FIG. 4, are configured analogously to the laser diode 1 illustrated. The laser diode 1 extends in the z-direction over a predefined resonator length. The laser bar 28 and thus the laser diode 1 may comprise a resonator length along the z-axis that is 4 mm long, for example. The laser diode 1 comprises a layer arrangement 2 comprising a first semiconductor layer 3 and a second semiconductor layer 4. The second semiconductor layer 4 is negatively doped. The first semiconductor layer 3 is positively doped. The dopings may also be configured inversely. An active zone 5 is configured between the first and second semiconductor layers 3, 4. Strip-shaped recesses 15, 16 are introduced into the layer arrangement 2, the recesses extending along the z-axis over the entire resonator length. The recesses 15, 16 constitute trenches and are arranged parallel at a defined distance in the x-direction.

The recesses 15, 16 extend in the Y-direction from a top side of the first semiconductor layer 3 right into the second semiconductor layer 4. The recesses 15, 16 may also be introduced only into the first semiconductor layer 3 and not extend as far as the active zone 5 or right into the second semiconductor layer 4. A positively doped semiconducting further contact layer 17 is configured on the first semiconductor layer 3 between the recesses 15, 16. The further contact layer 17 covers part of the width of the first semiconductor layer 3 along the x-direction between the recesses 15, 16. The further contact layer 17 is configured in a strip-shaped fashion and extends in the z-direction over the entire length of the laser diode 1. The further contact layer 17 consists, for example, of the same semiconducting material as the first semiconducting layer 3 and is provided in particular with a higher positive doping. If the first semiconducting layer 3 is negatively doped, then the further contact layer 17 may be configured as a more highly negatively doped layer composed of the same material as the negatively doped semiconductor layer 3.

A top side of the layer arrangement 2 is provided with a passivation layer 18. The passivation layer 18 is configured in an electrically insulating fashion and formed from silicon oxide, for example. The passivation layer 18 comprises strip-shaped openings 19 above the further contact layer 17. The openings 19 extend along the z-direction. The electrical contact 6 in the form of a layer is applied on the passivation layer 18 and in the opening 19. In the example illustrated, the electrical contact 6 is configured on the entire surface of the passivation layer 18. The electrical contact 6 may be configured only in the opening 19, that is to say on the further contact layer 17. In this example, the electrical contact 6 comprises a strip-like structure extending along the z-direction.

The further semiconducting contact layer 17 may be dispensed with, wherein, in this example, the first semiconductor layer 3 adjoins the opening 19 of the passivation layer 18. In this example, the electrical contact 6 is arranged directly on the first semiconductor layer 3. The electrical contact 6 is configured in the form of a layer structure comprising an adhesion layer 7 and a contact layer 8. The adhesion layer 7 is arranged directly on the further contact layer 17 or on the passivation layer 18. The contact layer 8 is applied on the adhesion layer 7. The adhesion layer 7 is formed from a metallic material, in particular from titanium, or comprises at least one metallic material, in particular titanium.

The contact layer 8 comprises at least one metallic layer. The metallic layer may be configured in the form of a gold layer. Moreover, the metallic contact layer 8 may comprise a diffusion barrier layer, e.g., in the form of a platinum layer arranged on the adhesion layer 7. A further metallic layer, e.g., comprising a gold layer, is arranged on the diffusion barrier layer. Metals other than platinum or gold may also be used for the configuration of the contact layer 8.

A strain layer 21 may be configured in the electrical contact 6. The strain layer 21 is configured as an electrically conductive layer. The strain layer 21 may be formed from a metal or comprise metal. The strain layer 21 may be formed from titanium tungsten nitrite, for example. One function of the strain layer 21 consists of achieving a desired strain of the layer arrangement 2 to define a defined lateral emission angle range. The strain layer 21 extends at least over the entire area of the electrical contact 6. Since the electrical contact 6 was deposited as layers successively onto the top side of the passivation layer 18, the shapes of the first and second trenches 15, 16 are correspondingly reproduced in the shape of the electrical contact 6, the shape of the further metal layer 20 and the shape of the strain layer 21.

Figure 5:
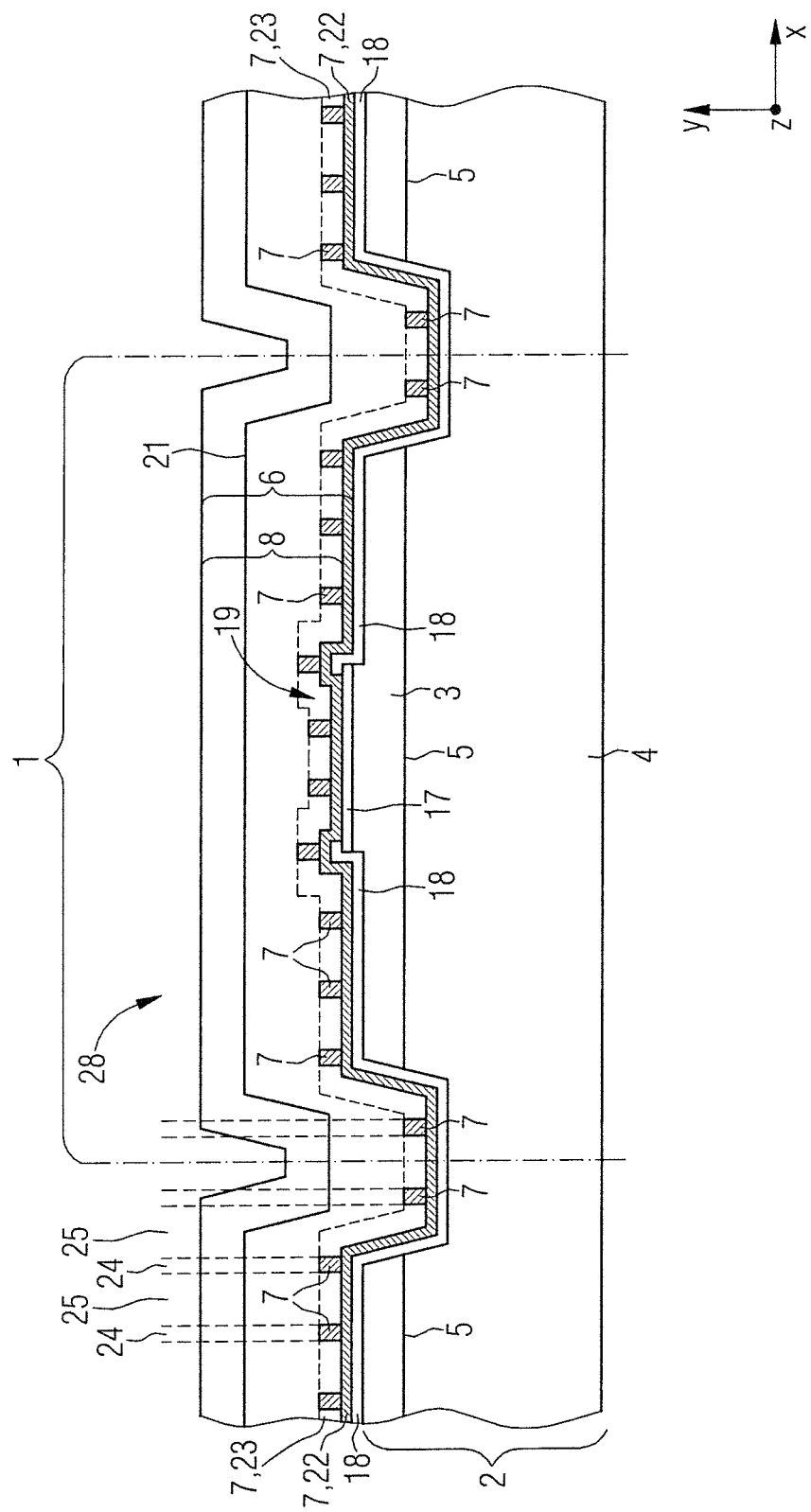
FIG. 5 shows a cross section through a part of a further laser bar.

FIG. 5 shows a partial cross section through a further example of a laser bar 28 comprising a laser diode 1 configured substantially in accordance with the example from FIG. 4. The laser bar 28 may comprise a plurality of laser diodes 1 arranged alongside one another in the laser bar. In contrast to the example in FIG. 4, in this example the adhesion layer 7 comprises a first layer 22 and a second structured layer 23. The first layer 22 is configured as a planar layer. The first layer 22 covers at least the opening 19 of the passivation layer 18 over the whole area. In the example illustrated, the first layer 22 of the adhesion layer 7 covers the entire surface of the passivation layer 18 and the surface of the opening 19. A second structured layer 23 of the adhesion layer 7 is configured on the first layer 22 of the adhesion layer 7.

The second layer 23 is subdivided into first partial surfaces 24 and into second partial surfaces 25. The adhesion layer 7 is arranged in the first partial surfaces 24. The contact layer 8 is arranged in the second partial surfaces 25. The first and second partial surfaces 24, 25 are illustrated only schematically in the example illustrated. The adhesion layer 7 and/or the contact layer 8 may be arranged only above the opening 19 of the passivation layer 18, too. The second layer 23 of the adhesion layer 7 is illustrated schematically with the aid of a dashed line. By this example of the adhesion layer 7, first it is possible to realize the adhesion function of the adhesion layer 7. Second, with the aid of the structured second layer 23 of the adhesion layer 7, it is possible to achieve the desired strain for the desired setting of the lateral emission angle range. In this example, too, a strain layer 21 may be provided in the contact layer 8.

The following FIGS. 6 to 13 show various examples of the adhesion layer 7 of laser diodes. The adhesion layers 7 may be provided in one of the described laser diodes from FIGS. 1 to 5. The layers above the adhesion layer 7 and below the adhesion layer 7 are not illustrated in these illustrations. A strip-like active region 26 of the active zone 5 is situated below the adhesion layer 7 in the layer arrangement 2. The active region 26 of the active zone 5 is illustrated schematically by two dotted lines. Electromagnetic radiation is emitted in a lateral emission angle range 10 via the emission sides 14.

Figure 6:
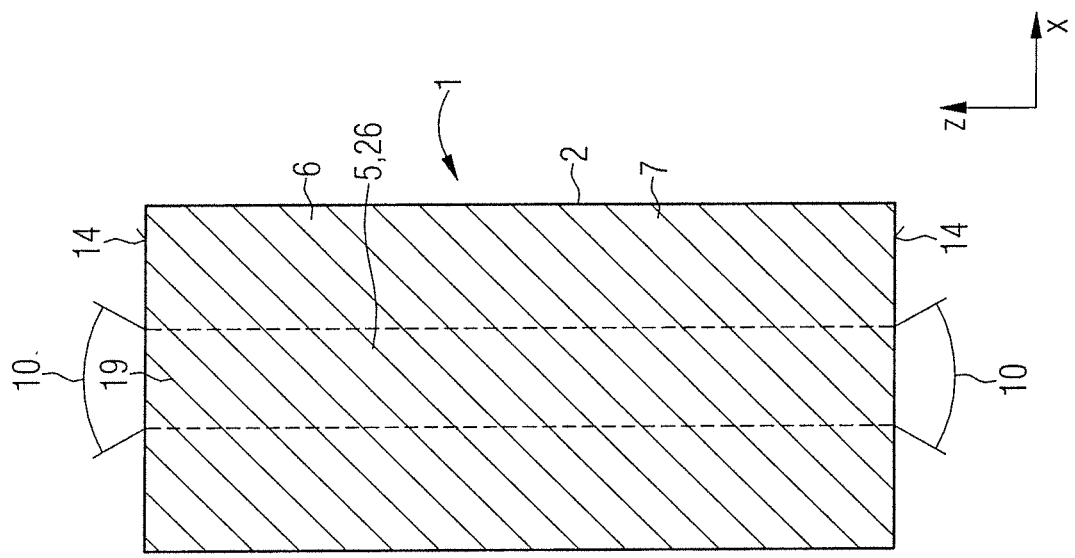

FIG. 6 shows a schematic plan view from above of a planar adhesion layer 7 of a laser diode, which may be configured in accordance with the described examples from FIGS. 1 to 5.

Figure 7:
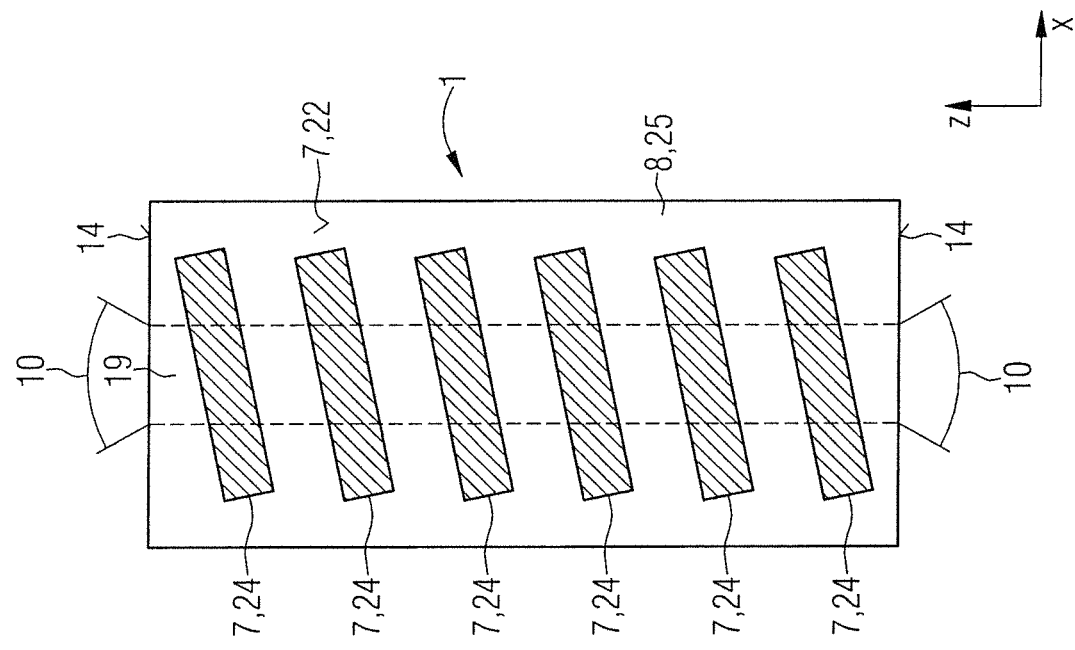
FIGS. 6 to 13 show schematic illustrations of various adhesion layers.

FIG. 7 shows, in a schematic illustration, a plan view of a further example of an adhesion layer 7 of a laser diode that may be configured in accordance with the described examples from FIGS. 1 to 5. In the example illustrated, the adhesion layer 7 is configured in the form of a first layer 22 and a second layer 23. The first layer 22 is configured as a planar layer that covers at least the opening 19 of the passivation layer 18, in particular the entire passivation layer 18. The opening 19 is illustrated schematically by dashed lines. The second layer 23 of the adhesion layer 7 is subdivided into first partial surfaces 24 and into a second partial surface 25. The first partial surfaces 24 are filled with the adhesion layer 7. The first partial surfaces 24 are configured in the form of strips aligned transversely with respect to the longitudinal axis of the opening 19 and thus transversely with respect to the longitudinal axis of the laser diode 1. By way of example, the first partial surfaces may comprise a rectangular shape. The rectangular shape may comprise a ratio of a vent to a width of 20 to 1. By way of example, the first partial surfaces 24 may be 200 µm long and 10 µm wide.

The second partial surface 25 comprises the remaining region of the second layer 23. Six strip-like first partial surfaces 24 are configured in the example illustrated. The strip-like first partial surfaces 24 are arranged in a manner inclined at an angle not equal to 90° with respect to the longitudinal axis, i.e., with respect to the z-direction of the laser diode 1. The strip-like partial surfaces 24 extend over a width of approximately two thirds of the width of the laser diode 1 in the x-direction. Moreover, the first strip-shaped partial surfaces 24 comprise a width in the z-direction that corresponds approximately to one quarter of the length of the first partial surfaces 24.

Figure 8:
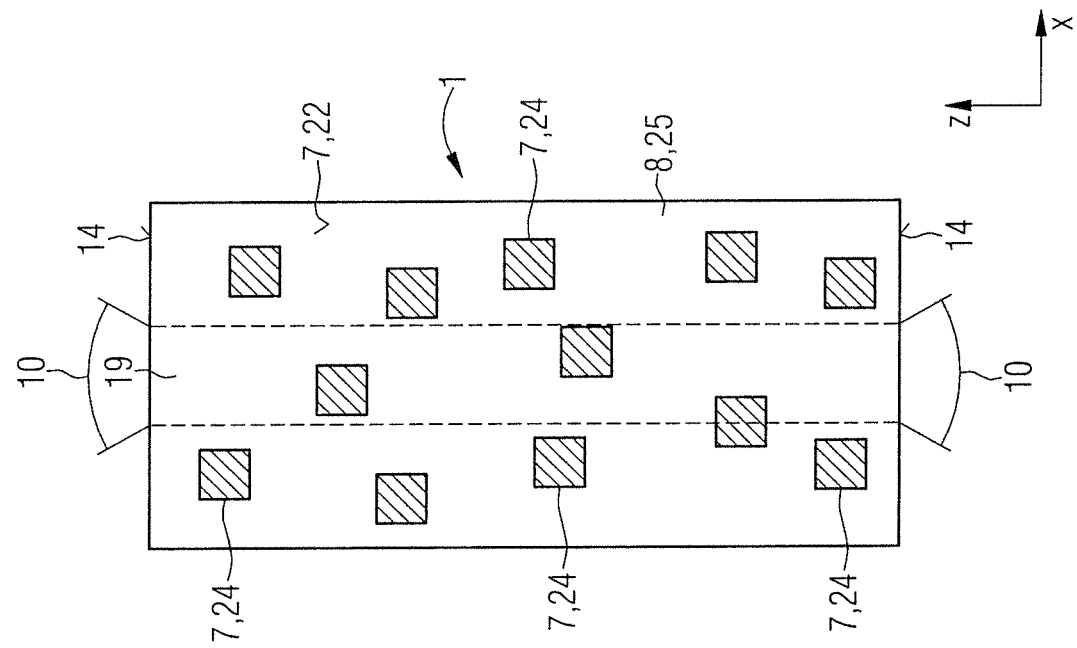

FIG. 8 shows a schematic cross section in the plane of the adhesion layer 7 of a laser diode, which may be configured in accordance with the described examples from FIGS. 1 to 5. The adhesion layer 7 is subdivided into a first layer 22 and a second layer 23. The second layer 23 comprises first square partial surfaces 24. The remaining region of the second layer 23 is filled by the second partial surface 25. The first square partial surfaces 24 are arranged in three series, wherein each series is aligned parallel to a longitudinal axis of the laser diode 1. Moreover, the first partial surfaces 24 are arranged at a distance of equal magnitude from one another. The adhesion layer 7 is arranged in the first partial surfaces 24. The contact layer 8 is arranged in the second partial surface 25. More than three series or at least three series of first square partial surfaces 24 may also be provided. The first square partial surfaces 24 may comprise a size of, e.g., 10 µm*10 µm. The first square partial surfaces 24 may also comprise other sizes that are smaller or larger than 10 µm*10 µm. Moreover the first partial surfaces 24 may also be configured in a rectangular fashion.

Figure 9:
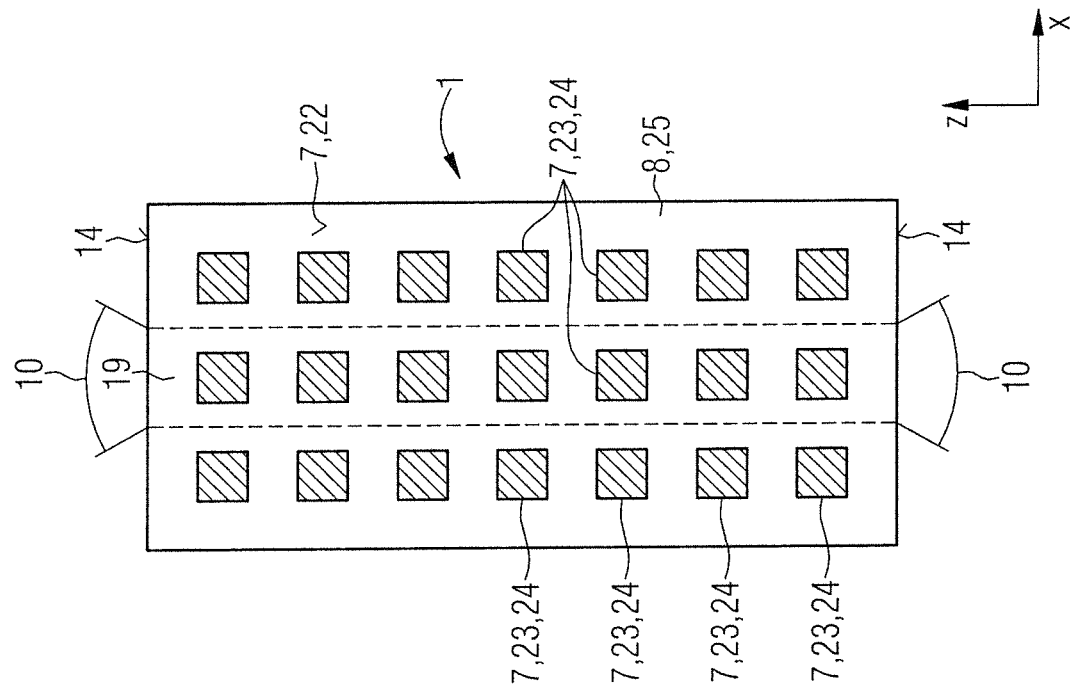

FIG. 9 shows a cross section through an adhesion layer 7 of a laser diode that may be configured in accordance with the described examples from FIGS. 1 to 5. The adhesion layer 7 comprises a whole-area first layer 22 and a structured second layer 23. First partial surfaces 24 of the second layer 23 are configured in the form of squares. The first square partial surfaces 24 are arranged in a disordered fashion over the first layer 22. The contact layer 8 is arranged in the region of the second partial surfaces 25 of the second layer 23. The first square partial surfaces 24 may comprise a size of, e.g., 10 µm*10 µm. The first square partial surfaces 24 may also comprise other sizes that are smaller or larger than 10 µm*10 µm. Moreover, the first partial surfaces 24 may also be configured in a rectangular fashion.

Figure 10:
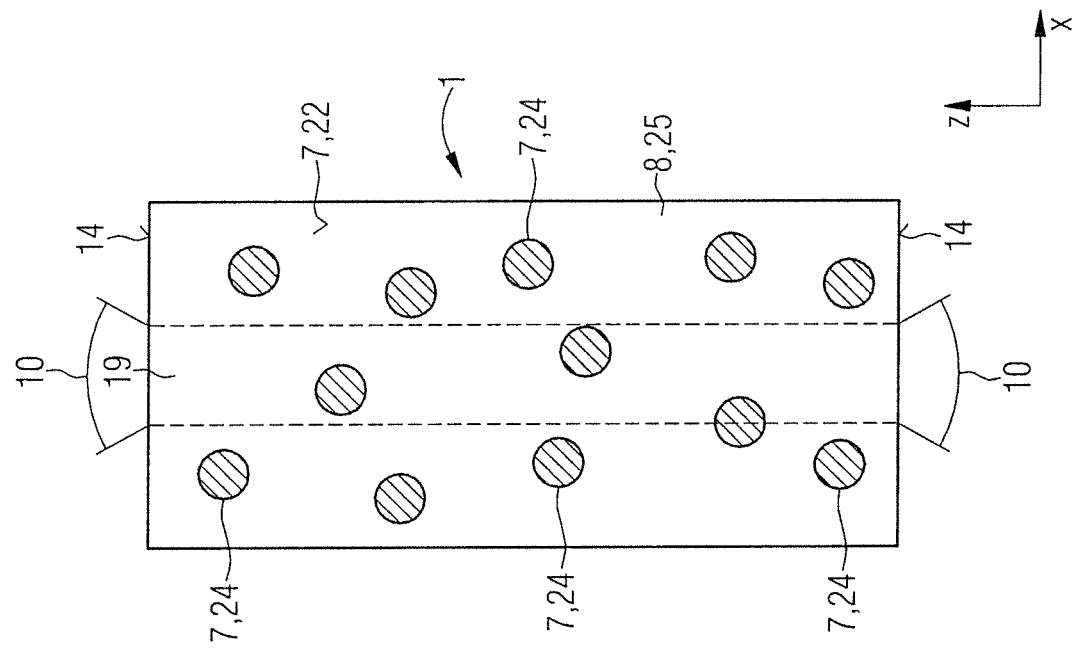

FIG. 10 shows a plan view of an adhesion layer 7 configured substantially in accordance with the arrangement in FIG. 8, but in this example the first partial surfaces 24 are configured in the form of circular surfaces. By way of example, the diameter of the circular surface may be in the region of 10 μm. The diameter of the circular surface may also be larger or smaller by a multiple.

Figure 11:
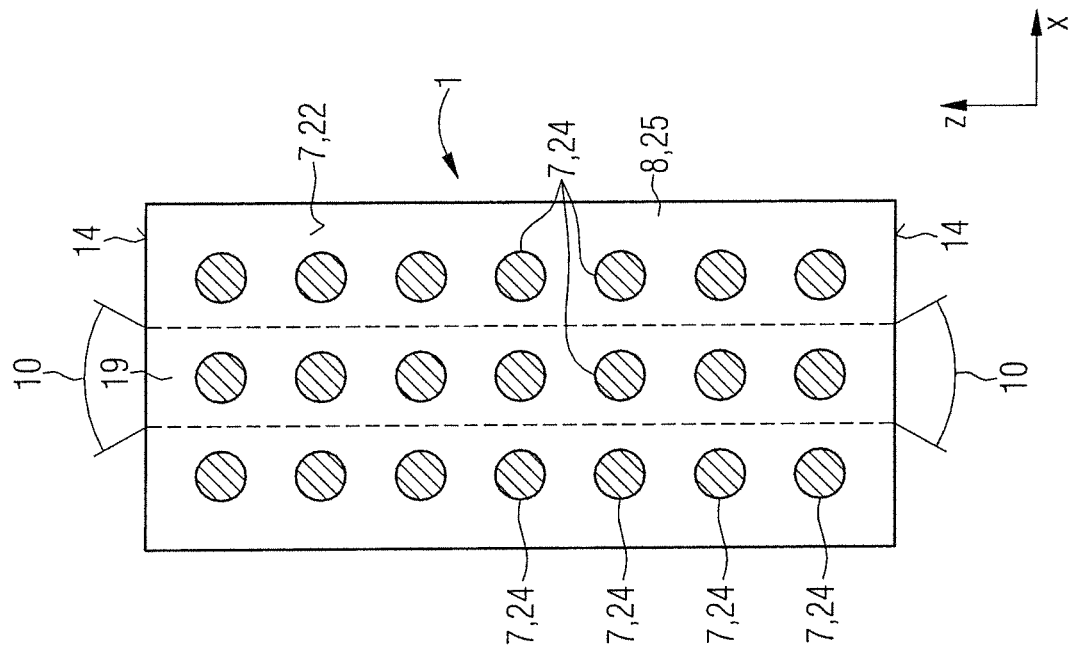

FIG. 11 shows a cross section in the region of the adhesion layer 7 of a laser diode 1, wherein this example substantially corresponds to the adhesion layer 7 from FIG. 9. In contrast to the example from FIG. 9, in this example, the first partial surfaces 24 comprise circular surface shapes. The first circular partial surfaces 24 are filled with the adhesion layer 7. By way of example, the diameter of the circular partial surfaces 24 may be in the region of 10 μm. The diameter of the circular surface may also be larger or smaller by a multiple. The contact layer 8 is arranged in the second partial surface 25.

Figure 12:
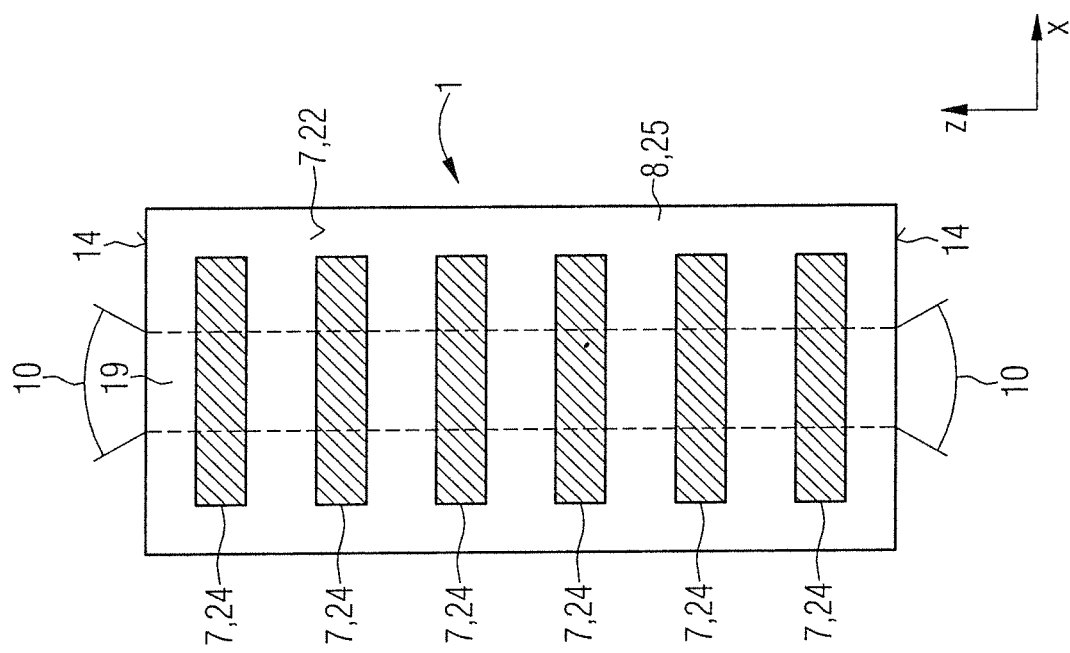

FIG. 12 shows a cross section through a further example of a laser diode 1 in the region of the adhesion layer 7. In the example illustrated, the adhesion layer 7 is configured in a manner similar to the example from FIG. 7, wherein in this example, the first strip-shaped partial surfaces 24 are arranged at a right angle with respect to the longitudinal extent, i.e., the z-axis of the laser diode 1.

Figure 13:
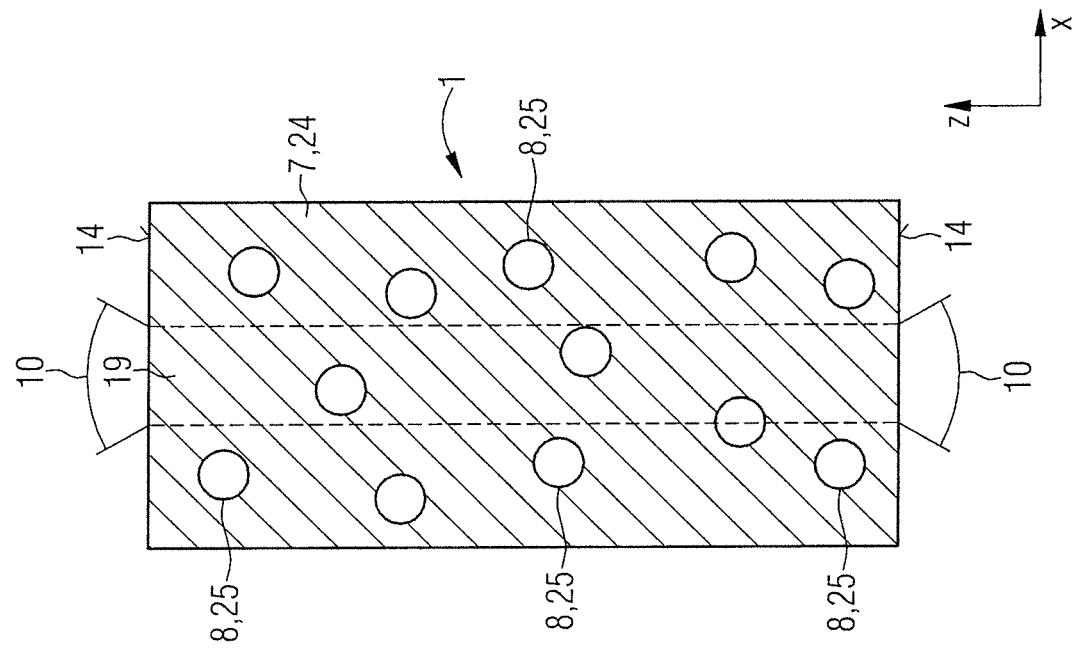

FIG. 13 shows a cross section through an adhesion layer 7 of a further example of a laser diode 1, wherein this example substantially corresponds to the example from FIG. 11, but the second partial surfaces 25 are configured as circular surfaces and the first partial surface 24 fills the remaining region of the second layer 23. By way of example, the diameter of the circular first partial surfaces 24 may be in the region of 10 μm. The diameter of the circular surface may also be larger or smaller by a multiple.

In an analogous manner, the examples in FIGS. 7 to 12 may also be configured inversely such that the second partial surfaces comprise the shape of the first partial surfaces and the first partial surfaces comprise the shape of the second partial surfaces.

In the examples described, the adhesion layer 7, in particular a titanium layer, may comprise a thickness of 35 angstroms. The semiconductor layers of the layer arrangement may be produced with the aid of epitaxial deposition methods. The further semiconducting contact layer 17 may be produced by a corresponding structuring of the first semiconductor layer 3. Both the adhesion layer 7 and the contact layer 8 may be laterally structured. Besides the adhesion layer, the other metal layers also contribute to the strain of the semiconductor layers. A heat treatment process is used to produce the laser diode. In this case, the laser diode is heated to temperatures of, for example, 350° C. or more, in particular 400° C. or more for a time duration of, for example, 3 minutes or longer, in particular for 5 minutes or longer, and is subsequently cooled again. An RTA furnace may be used for the heat treatment process.

In the described examples of the laser diodes, the second layer of the adhesion layer may comprise the first partial surface or the second partial surface for more than 10% of the area. Moreover, in the described examples of the laser diodes, the second layer of the adhesion layer may comprise the first partial surface or the second partial surface for more than 20% of the area or more than 30% of the area or more than 40% of the area.

Figure 14:
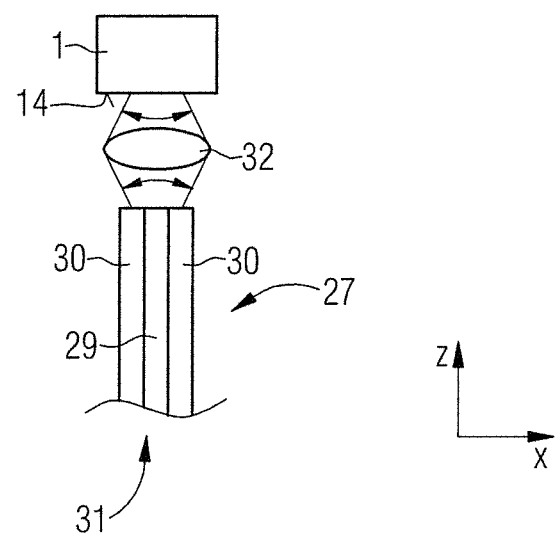
FIG. 14 shows a schematic illustration of a system comprising a laser diode and an optical waveguide.

FIG. 14 shows a schematic illustration of a laser diode 1, on the emission side 14 of which a lens 28 is arranged. The laser diode 1 emits the electromagnetic radiation at a lateral emission angle 10 in the direction of the lens 28. The lens 28 couples the radiation into the optical waveguide 27, which is configured in the form of an optical fiber. Two lenses or a plurality of lenses may also be provided to improve the coupling-in. The optical waveguide 27 may also be configured in the form of a fiber laser. Moreover, the laser diode 1 may also emit the electromagnetic radiation without lenses and/or without an optical waveguide 27. The laser diode 1 may also emit the electromagnetic radiation without an optical waveguide.

The above-described examples of the laser diodes, in particular also of the laser bars, are suitable for the system of optically pumping a fiber laser as illustrated in FIG. 14. The laser diodes 1 described or the laser bars described may also be used for other applications.

In all examples, the adhesion layer 7 may comprise a thickness that is 10 nm to 100 nm. In all examples, the strain layer 21 may comprise a thickness of 10 nm to 100 nm. Moreover, the strain layer 21 may extend over the entire area of the contact layer 8. In all examples, the first layer 22 of the adhesion layer 7 may comprise a thickness that is 10 nm to 100 nm. In all examples, the second layer 23 of the adhesion layer 7 may comprise a thickness that is 10 nm to 100 nm.

Our laser diodes and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2017 103 789.6, the subject matter of which is incorporated herein by reference.

The invention claimed is:

1. A laser diode comprising a layer arrangement comprising at least two semiconductor layers arranged one above another, wherein the semiconductor layers form an active zone in a plane, the active zone generates an electromagnetic radiation, the active zone emits the radiation in a lateral emission angle range in the plane of the active zone via an emission side of the layer arrangement, an electrical contact is configured on a top side of the layer arrangement, the electrical contact comprises a metallic adhesion layer and at least one metallic contact layer, the adhesion layer is arranged on the layer arrangement, the adhesion layer comprises a layer stack comprising a first and a second layer, the first layer is arranged on the layer arrangement, the first layer is configured in a planar fashion, the second layer is subdivided into at least one first and at least one second partial surface, the adhesion layer is arranged in the first partial surface, the second partial surface is free of the adhesion layer, the contact layer is arranged on the first partial surface of the second layer, the contact layer is arranged in the second partial surface and directly on the first layer of the adhesion layer.

2. The laser diode according to claim 1, wherein an electrically conductive strain layer is arranged as a layer within the contact layer, and the strain layer comprises a thickness and/or a structure to influence the lateral emission angle range.

3. The laser diode according to claim 1, wherein an electrically conductive strain layer is arranged as a layer within the contact layer, the strain layer comprises a thickness and/or a structure to influence the lateral emission angle range, and the strain layer comprises or consists of titanium or TiWN.

4. The laser diode according to claim 1, wherein the contact layer comprises a platinum layer and a gold layer, the platinum layer is arranged on the adhesion layer, and the gold layer is arranged on the platinum layer.

5. The laser diode according to claim 1, wherein the adhesion layer comprises titanium or is formed from titanium.

6. The laser diode according to claim 1, wherein the first and/or the second partial surfaces are arranged in a grid with defined spacings, an electrically conductive strain layer is arranged within the contact layer, and the strain layer comprises a thickness and/or a structure to influence the lateral emission angle range.

7. The laser diode according to claim 1, wherein the adhesion is used as a strain layer, wherein the lateral emission angle range depends on a thickness of the adhesion layer or a structuring of the adhesion layer, wherein the lateral emission angle range is reduced by a reduction of the layer thickness of the adhesion layer or a structuring of the adhesion layer.

8. A laser diode comprising a layer arrangement comprising at least two semiconductor layers arranged one above another, wherein the semiconductor layers form an active zone in a plane, the active zone generates an electromagnetic radiation, the active zone emits the radiation in a lateral emission angle range in the plane of the active zone via an emission side of the layer arrangement, an electrical contact is configured on a top side of the layer arrangement, the electrical contact comprises a metallic adhesion layer and at least one metallic contact layer, the adhesion layer is arranged directly on the layer arrangement, the adhesion layer comprises adhesion material, the adhesion layer comprises a layer stack comprising a first and a second layer, the first layer is arranged on the layer arrangement, the first layer is made of adhesion material and configured in a planar fashion, the second layer is subdivided into at least one first and at least one second partial surface, the adhesion material is arranged in the first partial surface of the second layer, the second partial surface of the second layer is free of the adhesion material, the adhesion material of the first layer is the same as the adhesion material of the first partial surface of the second layer, the contact layer is directly arranged on the first partial surface of the second layer, and the contact layer is arranged in the second partial surface of the second layer directly on the first layer.

9. The laser diode according to claim 8, wherein the adhesion layer comprises titanium or is formed from titanium.

10. The laser diode according to claim 8, wherein the second layer of the adhesion layer is subdivided into one first and at least two second partial surfaces, wherein the second partial surfaces are surrounded by the first partial surface, wherein the adhesion material is arranged in the first partial surface of the second layer, wherein the two second partial surfaces of the second layer are free of adhesion material, wherein the contact layer is directly arranged on the first partial surface of the second layer, wherein the contact layer is arranged in the two second partial surfaces of the second layer and within the second partial surfaces directly on the first layer.

11. The laser diode according to claim 8, wherein the adhesion is used as a strain layer, wherein the lateral emission angle range depends on a thickness of the adhesion layer or a structuring of the adhesion layer, wherein the lateral emission angle range is reduced by a reduction of the layer thickness of the adhesion layer or a structuring of the adhesion layer.

12. The laser diode according to claim 8, wherein a strain layer is arranged as an electrically conductive layer within the metal contact, the strain layer comprises a thickness and/or a structure to influence the lateral emission angle of the laser diode, wherein the strain layer is made of a different material than the metal contact.

13. The laser diode according to claim 12, wherein the strain layer comprises metal or is formed from metal.

14. The laser diode of claim 12, wherein the strain layer extends over the entire surface of the electrical contact.

15. A laser diode comprising a layer arrangement comprising at least two semiconductor layers arranged one above another, wherein the semiconductor layers form an active zone in a plane, the active zone generates an electromagnetic radiation, the active zone emits the radiation in a lateral emission angle range in the plane of the active zone via an emission side of the layer arrangement, an electrical contact is configured on a top side of the layer arrangement, the electrical contact comprises a metallic adhesion layer and at least one metallic contact layer, the adhesion layer is directly arranged on the layer arrangement, the adhesion layer comprises adhesion material, the adhesion layer comprises a layer stack comprising a first and a second layer, the first layer is arranged on the layer arrangement, the first layer is made of adhesion material and configured in a planar fashion, the second layer is subdivided into at least one first and at least one second partial surface, the adhesion material is arranged in the first partial surface of the second layer, the second partial surface of the second layer is free of the adhesion material, the contact layer is directly arranged on the first partial surface of the second layer, the contact layer is arranged in the second partial surface of the second layer directly on the first layer, wherein the adhesion layer is used as a strain layer, and the lateral emission angle range depends on a thickness of the adhesion layer or a structuring of the adhesion layer.

16. The laser diode of claim 15, wherein the adhesion material in the first layer and in the first partial surfaces of the second layer comprises titanium or is formed of titanium.

17. The laser diode according to claim 15, wherein the second layer of the adhesion layer is subdivided into one first and at least two second partial surfaces, wherein the second partial surfaces are surrounded by the first partial surface, wherein the adhesion material is arranged in the first partial surface of the second layer, wherein the two second partial surfaces of the second layer are free of adhesion material, wherein the contact layer is directly arranged on the first partial surface of the second layer, wherein the contact layer is arranged in the two second partial surfaces of the second layer and within the second partial surfaces directly on the first layer.

18. The laser diode according to claim 15, wherein a strain layer is arranged as an electrically conductive layer within the metal contact, the strain layer comprises a thickness and/or a structure to influence the lateral emission angle of the laser diode, wherein the strain layer is made of a different material than the metal contact.

* * * * *